(12) United States Patent
Todorov et al.

(10) Patent No.: US 9,219,201 B1
(45) Date of Patent: Dec. 22, 2015

(54) BLUE LIGHT EMITTING DEVICES THAT INCLUDE PHOSPHOR-CONVERTED BLUE LIGHT EMITTING DIODES

(71) Applicant: Cree, Inc., Durham, NC (US)

(72) Inventors: Iliya Todorov, Durham, NC (US); Harry Seibel, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/529,327

(22) Filed: Oct. 31, 2014

(51) Int. Cl.
*H01L 33/50* (2010.01)
*C09K 11/80* (2006.01)
*H01L 33/20* (2010.01)
*H01L 33/54* (2010.01)
*C09K 11/77* (2006.01)

(52) U.S. Cl.
CPC .......... *H01L 33/502* (2013.01); *C09K 11/7706* (2013.01); *H01L 33/20* (2013.01); *H01L 33/505* (2013.01); *H01L 33/507* (2013.01); *H01L 33/54* (2013.01)

(58) Field of Classification Search
CPC .................................................. H01L 33/502
See application file for complete search history.

(56) References Cited

U.S. PATENT DOCUMENTS 8,547,010 B2 * 10/2013 Jagt ...................... H01L 33/504
257/E33.06
2007/0158668 A1   7/2007  Tarsa et al.
2007/0262702 A1 * 11/2007 Fujita ........................ C03C 4/12
313/503
2008/0173884 A1   7/2008  Chitnis et al.
2008/0179611 A1   7/2008  Chitnis et al.
2010/0155763 A1   6/2010  Donofrio et al.
2012/0193648 A1   8/2012  Donofrio et al.
2013/0119418 A1   5/2013  Donofrio et al.

OTHER PUBLICATIONS

U.S. Appl. No. 14/120,297, filed May 14, 2014 entitled: Phosphor-Converted Light Emitting Device.

* cited by examiner

*Primary Examiner* — Victor A Mandala
*Assistant Examiner* — Regan Rundio
(74) *Attorney, Agent, or Firm* — Myers Bigel Sibley & Sajovec, P.A.

(57) ABSTRACT

Light emitting devices include a blue LED that emits blue light having a peak wavelength between 430 nanometers and 480 nanometers and a recipient luminophoric medium that includes luminescent materials that down-convert a portion of the blue light emitted by the blue LED to light having a peak wavelength that is between about 500 nanometers and about 545 nanometers. The combination of the blue light emitted by the blue LED and the light emitted by the luminescent materials in the recipient luminophoric medium comprises light that is perceived as blue light having a color point that falls within the region on the 1931 CIE Chromaticity Diagram defined by ccx, ccy chromaticity coordinates of (0.1355, 0.0399), (0.175, 0.0985), (0.1743 0.1581), (0.1096, 0.0868), (0.1355, 0.0399).

25 Claims, 8 Drawing Sheets

BLUE LIGHT EMITTING DEVICES THAT INCLUDE PHOSPHOR-CONVERTED BLUE LIGHT EMITTING DIODES

FIELD

The present invention relates generally to light emitting devices and, more particularly, to light emitting devices that use phosphor-converted light emitting diodes ("LEDs").

BACKGROUND

LEDs are solid state lighting devices that convert electric energy into light. LEDs include both semiconductor-based LEDs and organic LEDs. Semiconductor-based LEDs typically include a plurality of semiconductor layers that are epitaxially grown on a semiconductor or non-semiconductor substrate such as, for example, sapphire, silicon, silicon carbide, gallium nitride or gallium arsenide substrates. One or more semiconductor p-n junctions are formed in these epitaxial layers. When a sufficient voltage is applied across the p-n junction, electrons in the n-type semiconductor layers and holes in the p-type semiconductor layers flow toward the p-n junction. The epitaxial structure may include cladding layers, quantum wells or the like that are designed to trap some of the electrons and holes in the vicinity of the p-n junction. When an electron and a hole collide they recombine and a photon of light is emitted, which is how LEDs generate light. The wavelength distribution of the light generated by an LED generally depends on the semiconductor materials used and the structure of the thin epitaxial layers that make up the "active region" of the device (i.e., the area where the electrons and holes recombine).

The peak wavelength of an LED refers to the wavelength where the radiometric emission spectrum of the LED reaches its maximum value as detected by a photo-detector. The radiometric emission spectrum, which is also referred to as the "spectral power distribution" of the LED, is a plot of the radiant flux for the light emitted by the LED as a function of wavelength. The radiant flux of the LED (which is also referred to as "radiant power") is a measure of the intensity of the light emitted by the LED in Watts (or an equivalent unit of measure). An LED typically has a radiometric emission spectrum that has a narrow wavelength distribution that is tightly centered about the peak wavelength of the LED. For example, the radiometric emission spectrum of a typical LED may have a width of, for example, about 10-30 nm, where the width is measured at half the maximum illumination (referred to as the full width half maximum or "FWHM" width).

LEDs may also be identified by their "dominant" wavelength, which is the wavelength where the radiometric emission spectrum of the LED, as perceived by the human eye, reaches its maximum value. The dominant wavelength thus differs from the peak wavelength in that the dominant wavelength takes into account the sensitivity of the human eye to different wavelengths of light.

Most visible light sources emit light at many different wavelengths. The apparent color of visible light can be illustrated with reference to a two-dimensional chromaticity diagram, such as the 1931 CIE Chromaticity Diagram illustrated in FIG. 1. Chromaticity diagrams provide a useful reference for defining colors as weighted sums of different colors.

As shown in FIG. 1, colors on a 1931 CIE Chromaticity Diagram are defined by x and y "chromaticity" coordinates. Each (x, y) value in the 1931 CIE Chromaticity Diagram of FIG. 1 is a distinct "color point." As shown in FIG. 1, the color points within the visible light spectrum fall within a generally U-shaped area. Colors on or near the outside of the area are "saturated" colors composed of light having a single wavelength (monochromatic light), or light having a very small wavelength distribution. The numerical values specified about the periphery of the U-shaped curve of FIG. 1 show the wavelength of monochromatic light that corresponds to various points on the curve. Colors in the interior of the U-shaped area of FIG. 1 are "unsaturated" colors that are composed of a mixture of different wavelengths of light. White light, which can be a mixture of many different wavelengths, is generally found near the middle of the diagram, in the region labeled 10 in FIG. 1. There are many different hues of light that may be considered "white" or near white, as evidenced by the size of the region 10.

Light that generally appears green or includes a substantial green component is plotted in the regions that are above the white region 10, while light below the white region 10 generally appears pink, purple or magenta. Light that generally appears red falls in the lower right hand side of the U-shaped region of FIG. 1, while light that generally appears blue falls to the left of the white region 10 of FIG. 1.

A binary combination of light from two different light sources will appear to have a different color than either of the two constituent colors, where the color of the combined light will depend on the wavelengths and relative intensities of the two light sources. For example, light emitted by a combination of a blue source and a red source may appear purple or magenta to an observer.

As most LEDs are saturated light sources that appear to emit light having a single color, LED-based light emitting devices that produce white light have been introduced in which light emitted by an LED is passed through one or more luminescent materials (such as phosphor particles) that convert some of the light emitted by the LED to light of other colors. The combination of the light emitted by the single-color LED that passes through the luminescent material along with the light of different colors that is emitted by the luminescent materials may produce white or near-white light. For example, a single blue-emitting LED (e.g., made of indium gallium nitride and/or gallium nitride) may be used in combination with a yellow phosphor such as for example, cerium-doped yttrium aluminum garnet ($Y_3Al_5O_{12}$:Ce), that "down-converts" the wavelength of some of the blue light emitted by the LED, changing its color to yellow. In a blue LED/yellow phosphor lamp, the blue LED produces an emission with a dominant wavelength of, for example, about 455-470 nanometers, and the phosphor produces yellow fluorescence with a peak wavelength of, for example, about 550 nanometers in response to the blue emission. Some of the blue light passes through the phosphor (and/or between the phosphor particles) without being down-converted, while a substantial portion of the light is absorbed by the phosphor, which becomes excited and emits light across a broad spectrum that has a peak wavelength in the yellow color range (i.e., the blue light is down-converted to yellow light). The combination of blue light and yellow light may appear white to an observer.

LEDs are used in a host of applications including, for example, backlighting for liquid crystal displays, indicator lights, automotive headlights, flashlights and for general illumination.

SUMMARY

Pursuant to some embodiments of the present invention, light emitting devices are provided that include a blue LED that emits blue light having a peak wavelength between 430 nanometers and 480 nanometers and a recipient luminophoric medium that is configured to down-convert at least some of the blue light emitted by the blue LED. The recipient luminophoric medium includes luminescent materials that down-convert a portion of the blue light emitted by the blue LED to light having a peak wavelength that is between about 500 nanometers and about 545 nanometers. The combination of the blue light emitted by the blue LED and the light emitted by the luminescent materials in the recipient luminophoric medium comprises light that is perceived as blue light having a color point that falls within the region on the 1931 CIE Chromaticity Diagram defined by ccx, ccy chromaticity coordinates of (0.1355, 0.0399), (0.175, 0.0985), (0.1743 0.1581), (0.1096, 0.0868), (0.1355, 0.0399).

In some embodiments, less than 5% of the blue light emitted by the blue LED may be down-converted by the luminescent materials in the recipient luminophoric medium. In some embodiments, the blue light that is down-converted by the luminescent materials may have a peak wavelength that is between about 530 nanometers and about 545 nanometers. In some embodiments, the combination of the blue light emitted by the blue LED and the light emitted by the luminescent materials in the recipient luminophoric medium may have a radiometric emission spectra that has a spectral power output throughout the wavelength range of 500 nanometers to 570 nanometers that is between 2% and 9% of the spectral power output at the peak wavelength of the blue LED, and/or that has a radiometric emission spectra that has a spectral power output throughout the wavelength range of 520 nanometers to 560 nanometers that is between 3% and 6% of the spectral power output at the peak wavelength of the blue LED.

In some embodiments, a bottom surface of the blue LED may be mounted on a mounting substrate and the recipient luminophoric medium may be coated to an average thickness of less than 20 microns on a top surface of the blue LED. The luminescent materials may be LuAG:Ce phosphor particles in some embodiments. The luminescent materials may be narrowband luminescent materials having a full width half maximum width of less than 30 nanometers in other embodiments. The light emitting diode may, in some embodiments, have a peak wavelength between 450 and 458 nanometers Pursuant to further embodiments of the present invention, light emitting devices are provided that include a blue LED that emits blue light having a peak wavelength between 430 nanometers and 465 nanometers and a recipient luminophoric medium that is configured to down-convert at least some of the blue light emitted by the blue LED, the recipient luminophoric medium including luminescent materials that down-convert a portion of the blue light emitted by the blue LED to light having a peak wavelength that is between about 500 nanometers and about 545 nanometers. In these device, less than 5% of the blue light emitted by the blue LED is down-converted by the luminescent materials in the recipient luminophoric medium.

In some embodiments, the blue LED may emit blue light having a peak wavelength between 450 nanometers and 458 nanometers. In some embodiments, the luminescent materials may down-convert blue light emitted by the blue LED to light having a peak wavelength that is between about 530 nanometers and about 545 nanometers. In some embodiments, the combination of the blue light emitted by the blue LED and the light emitted by the luminescent materials in the recipient luminophoric medium may have a radiometric emission spectra that has a spectral power output throughout the wavelength range of 500 nanometers to 570 nanometers that is between 2% and 9% of the spectral power output at the peak wavelength of the blue LED. The combination of the blue light emitted by the blue LED and the light emitted by the luminescent materials in the recipient luminophoric medium may comprise light that is perceived as blue light having a color point that falls within the region on the 1931 CIE Chromaticity Diagram defined by ccx, ccy chromaticity coordinates of (0.16, 0.07621), (0.175, 0.0985), (0.1743 0.1581), (0.16, 0.1423), (0.16, 0.07621).

Pursuant to still further embodiments of the present invention, light emitting devices are provided that include a blue LED that emits blue light having a peak wavelength between 430 nanometers and 465 nanometers and a recipient luminophoric medium that is configured to down-convert at least some of the blue light emitted by the blue LED, the recipient luminophoric medium including luminescent materials that down-convert a portion of the blue light emitted by the blue LED to light having a peak wavelength that is between about 500 nanometers and about 545 nanometers. The combination of the blue light emitted by the blue LED and the light emitted by the luminescent materials of the recipient luminophoric medium has a radiometric emission spectra that has a spectral power output in the wavelength range of 500 nanometers to 570 nanometers that is between 2% and 9% of the spectral power output at the peak wavelength of the blue LED.

In some embodiments, less than 5% of the blue light emitted by the blue LED may be down-converted by the luminescent materials in the recipient luminophoric medium. In some embodiments, the combination of the blue light emitted by the blue LED and the light emitted by the luminescent materials in the recipient luminophoric medium may have a radiometric emission spectra that has a spectral power output throughout the wavelength range of 520 nanometers to 560 nanometers that is between 3% and 6% of the spectral power output at the peak wavelength of the blue LED. A bottom surface of the blue LED may be mounted on a mounting substrate and the recipient luminophoric medium may be coated to an average thickness of less than 20 microns on a top surface of the blue LED.

Pursuant to yet additional embodiments of the present invention, light emitting devices are provided that include a blue LED that emits blue light having a peak wavelength between 450 nanometers and 458 nanometers and a recipient luminophoric medium that is configured to down-convert at least some of the blue light emitted by the blue LED, the recipient luminophoric medium including luminescent materials that down-convert a portion of the blue light emitted by the blue LED to light having a peak wavelength that is between about 515 nanometers and about 545 nanometers. The recipient luminophoric medium may be coated to an average thickness of less than 20 microns on a top surface of the blue LED. Moreover, less than 10% of the blue light emitted by the blue LED is down-converted by the luminescent materials in the recipient luminophoric medium.

DETAILED DESCRIPTION

Blue light emitting diodes are used in a wide variety of applications including single-color signage applications, scoreboards, monochrome message boards, grow lights, advertising backlighting, police car siren lighting, show and entertainment lighting and the like. As discussed above, blue LEDs are saturated emitters that emit light having FWHM widths of, for example, about 10-30 nanometers.

While the radiant flux (i.e., the intensity of the light emitted) is an important parameter for an LED, the human eye has varying sensitivity to different wavelengths of light, and hence how bright a light source appears to a human observer will be a function of both the radiant flux of the light source and the wavelengths at which the light is emitted. Because of this varying sensitivity to light, the "brightness" of a light source is often defined in terms of the light source's "luminous flux," which is a measure of the power of the light emitted by a light source as perceived by a human observer. The luminous flux of a light source is typically measured in lumens (1m). The luminous flux of a light source differs from the radiant flux of the light source in that the radiant flux measures the total power emitted, while the luminous flux weights the power of the light emitted at each wavelength based on a luminosity function which represents the response of the human eye for each different wavelength.

Figure 1:
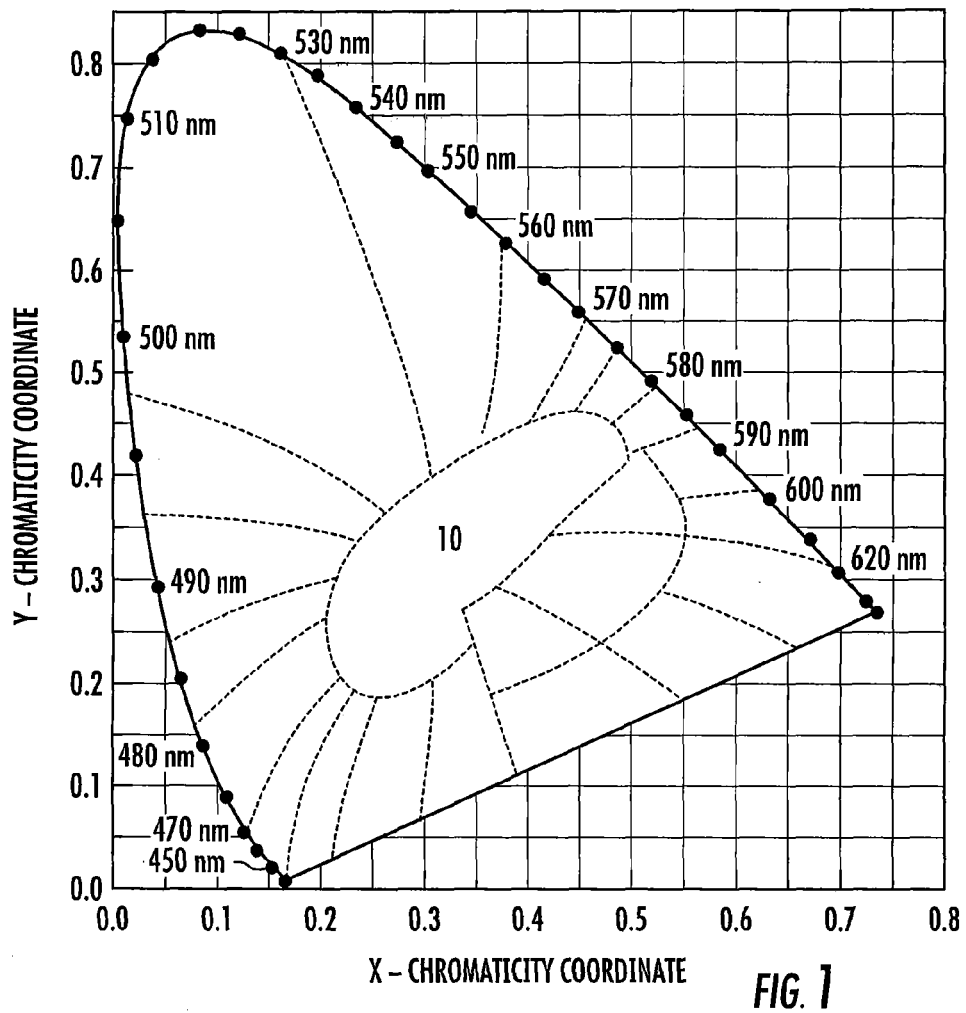
FIG. 1 is the 1931 CIE Chromaticity Diagram.
Figure 2:
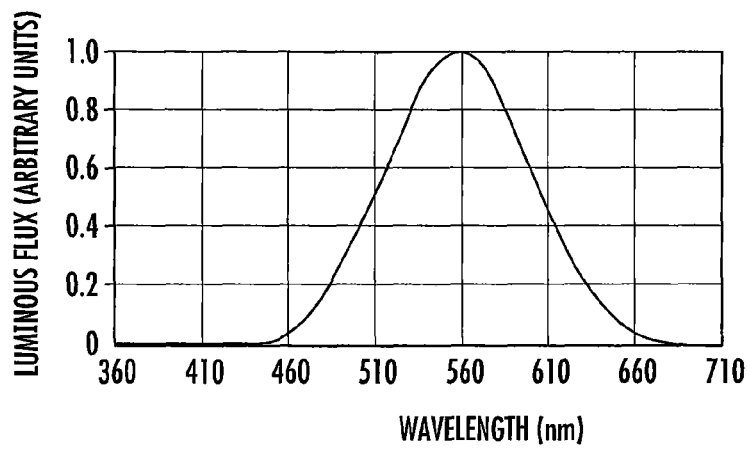
FIG. 2 is a graph that illustrates the response of the human eye to light of different wavelengths.

FIG. 2 is a graph that illustrates the response of the human eye to light in the visible spectrum. As is readily apparent from FIG. 2, the human eye has the greatest sensitivity to light that is at a wavelength of about 555 nm, which is generally considered to be at about the transition from the green color range to the yellow color range. The human eye generally has good sensitivity to light in the 510 nanometer to 600 nanometer wavelength range (which generally encompasses green, yellow and orange light) but the sensitivity of the human eye to light at shorter wavelengths (blue/purple light) and longer wavelengths (red light) is significantly reduced. Generally speaking, blue LEDs may be manufactured that have higher radiant flux over a desired range of operating temperatures than green LEDs fabricated using similar technology. However, because of the difference in the response of the human eye to blue and green light, a green LED may appear to be brighter than a corresponding blue LED.

Pursuant to embodiments of the present invention, blue light emitting devices that include phosphor-converted blue LEDs are provided that may exhibit enhanced luminous flux. The light emitting devices may comprise blue LEDs that have an associated recipient luminophoric medium that includes, for example, a small amount of green and/or yellow light emitting luminous materials. The recipient luminophoric medium may comprise, for example, a thin layer of material containing phosphor particles that is coated or otherwise deposited on the blue LED. The green and/or yellow phosphor particles absorb a small amount of the blue light emitted by the blue LED and convert that light to green or yellow light. Since only a very small percentage (e.g., less than 5%) of the blue light is down-converted to green/yellow light, the combination of blue and green/yellow light that is output by the device will appear as blue light to a human observer, and will fall within a region of the 1931 CIE Chromaticity Diagram that is considered to be blue light. Moreover, because of the increased contribution of light at wavelengths that are well-perceived by the human eye, the blue light emitting LED-based lighting devices according to embodiments of the present invention may be significantly brighter than conventional blue LEDs.

Blue LEDs have been available for decades. In applications that require a relatively high amount of blue light, the conventional solutions have been to (1) use longer wavelength blue LEDs that emit light that the human eye is more sensitive to, (2) to improve the design of the LED to provide higher power output or (3) to use more blue LEDs. Pursuant to embodiments of the present invention, high power solid state light emitting devices are provided that emit blue light that use phosphor-converted blue LEDs that include a small amount of green or yellow phosphor or other luminescent material. As only a small amount of the blue light is converted by the phosphor, the light emitted by the device will still appear blue. However, as the sensitivity of the human eye is greater to green and yellow light, even the small amount of such light included in the combined output of the light emitting device may be sufficient to significantly increase the brightness of the combined light output as perceived by a human observer.

In some embodiments, the phosphor-converted blue LEDs according to embodiments of the present invention may be designed so that more than 90% of the light emitted by the blue LED passes through the recipient luminophoric medium without being down-converted. This large "pass-through" blue component is designed to ensure that a human observer will perceive the light emitted by the device as being blue light, and that the light will fall within one of the color bins defined on the 1931 CIE Chromaticity Diagram that correspond to blue light. In other embodiments, more than 95% of the light emitted by the phosphor-coated blue LEDs may pass through the recipient luminophoric medium without being down-converted. In still other embodiments, more than 98% of the light emitted by the phosphor-coated blue LEDs may pass through the recipient luminophoric medium without being down-converted.

In some embodiments, the recipient luminophoric mediums (which may comprise, for example, a phosphor containing material that is coated on the blue LEDs) may be less than 30 microns thick. In some embodiments, very thin recipient luminophoric mediums may be used such as recipient luminophoric mediums that have an average thickness of less than 20 microns or recipient luminophoric mediums that have an average thickness of between 2 and 15 microns. Herein, the "average thickness" refers to the average thickness of the recipient luminophoric medium on a major surface of an LED or other surface that the recipient luminophoric medium is coated on, and thus takes into account differences in thickness that may be present or discontinuities (i.e., regions where no recipient luminophoric medium is deposited) which may occur with very thin coatings such as coatings of about 10 microns or less. It will also be appreciated that a recipient luminophoric medium may be deposited on a major surface of a blue LED in a predetermined pattern such as stripes, a checkerboard pattern, concentric circles, etc. so that the recipient luminophoric medium is only deposited on selected areas of the major surface of the blue LED. The "average thickness" of such a recipient luminophoric medium will be determined based on the thickness of the recipient luminophoric medium in the areas where the recipient luminophoric medium is deposited as well as the percentage of the area of the major surface of the blue LED that the recipient luminophoric medium is deposited on. Moreover, the blue LEDs that are used in the blue light emitting devices according to embodiments of the present invention may be relatively low wavelength blue LEDs such as, for example, blue LEDs having peak wavelengths between 430 nanometers and 458 nanometers. The recipient luminophoric medium may include phosphor particles having a peak emission wavelength of, for example, between about 515 nanometers and about 545 nanometers.

Example embodiments of the present invention will now be described with reference to FIGS. 3-7.

Figure 3A:
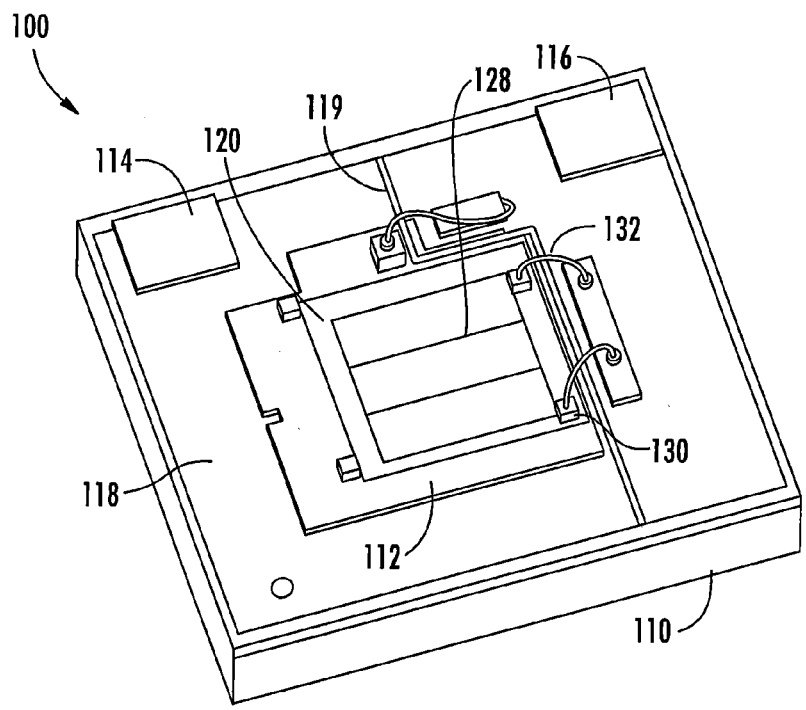
FIGS. 3A and 3B are a perspective view and a side view, respectively, of a semiconductor light emitting device according to embodiments of the present invention.
Figure 3C:
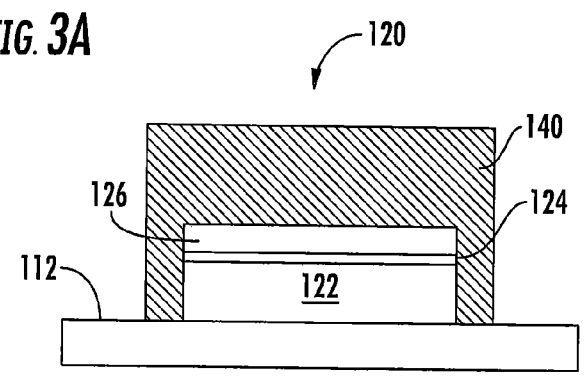
FIG. 3C is a schematic side view of an LED included in the semiconductor light emitting device of FIGS. 3A-3B.
Figure 3B:
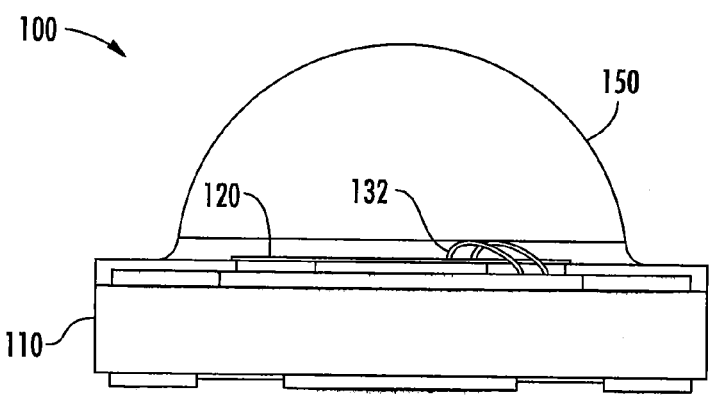

FIGS. 3A and 3B are a schematic plan view and a schematic side view of a blue light emitting device 100 that includes a phosphor-converted blue LED according to embodiments of the present invention. FIG. 3C is a schematic side view of an LED included in the semiconductor light emitting device of FIGS. 3A-3B.

As shown in FIG. 3A, the semiconductor light emitting device 100 includes a submount 110 on which a single LED chip or "die" 120 is mounted. The submount 110 can be formed of many different materials such as, for example, aluminum oxide, aluminum nitride, organic insulators, a printed circuit board (PCB), sapphire or silicon.

The LED 120 is a blue LED that emits radiation with a peak wavelength in a range of about 430 nm to about 480 nm. Blue LEDs are well known in the art, and are most typically formed using Group III-nitride compound semiconductors such as, for example, gallium nitride-based semiconductor materials that are epitaxially grown on a substrate. Cree, Inc. of Durham, N.C. manufactures a wide variety of such blue LEDs that are suitable for use as the blue LED 120. As shown in FIG. 3C, the LED 120 may include a plurality of epitaxial layers 124 that are grown on a growth substrate 122. The epitaxial layers 124 include at least one active layer/region where light emission occurs. The growth substrate 122 may comprise, for example, a silicon carbide or sapphire substrate, although other substrates may be used. Typically the epitaxial layers 124 will be grown on a relatively large silicon carbon of sapphire wafer (e.g., a diameter of 2-5 inches) that serves as the growth substrate 122, and this wafer may then be singulated into thousands of individual LED "chips," each of which may be used to form an LED 120. The growth substrate 122 can remain as part of the final singulated LED 120 or can be fully or partially removed.

The LED 120 may include additional layers and elements that are not shown in FIG. 3C including, for example, nucleation layers, light extraction layers, contact layers and/or light extraction elements. The active layer/region can comprise multiple layers and sub-layers and may include, for example, a single quantum well (SQW), multiple quantum well (MQW), double heterostructure and/or super lattice structures. The active region may be fabricated from different material systems, including, for example, Group-III nitride based material systems such as gallium nitride (GaN), aluminum gallium nitride (AlGaN), indium gallium nitride (InGaN) and/or aluminum indium gallium nitride (AlInGaN).

Referring to FIGS. 3A and 3C, the LED 120 may also include metallization 126. The metallization 126 may include a conductive current spreading structure 128 that is provided on the top surface of the LED 120, as well as one or more contacts 130 that are accessible at the top surface for wire bonding. The current spreading structure 128 and contacts 130 can be made of a conductive material such as Au, Cu, Ni, In, Al, Ag or combinations thereof, conducting oxides and transparent conducting oxides. The current spreading structure 128 may comprise spaced-apart conductive fingers that are arranged to enhance current spreading from the contacts 130 into the top surface of the LED 120. In operation, an electrical signal is applied to the contacts 130 through wire bonds 132, and the electrical signal spreads through the fingers of the current spreading structure 128 into the LED 120.

As shown in FIGS. 3A and 3B, the LED 120 may be mounted on the die attach pad 112 so that the substrate 122 of the LED 120 (if left on) contacts the die attach pad 112. Alternatively, the LED 120 may be mounted in a so-called "flip chip" orientation where the epitaxial layers 124 are between the substrate 122 and the die attach pad 112 so that light emission occurs through the substrate 122. In either case, a pair of contact pads 114, 116 may be provided on the submount 110 for applying electrical signals to the LED 120. In the embodiment of FIGS. 3A-3C, the blue LED 120 is a vertical device having a first contact (not shown) on the underside of the LED 120 and a second contact 130 (implemented as several separate contacts 130) on the top side of the LED 120. However, it will be appreciated that the blue LED 120 could instead be a horizontal device in which both contacts of the LED 120 are on the same side of the device, and the metallization, wire bonds and/or die attach pad could be suitably modified/rearranged to apply electrical signals to the LED contacts.

As shown best in FIG. 3C, the semiconductor light emitting device 100 further includes a recipient luminophoric medium 140 that is arranged to receive light emitted by the LED 120. The recipient luminophoric medium 140 may comprise an encapsulant material such as, for example, silicone, that has luminescent materials suspended therein. A "luminescent material" refers to a material such as a phosphor particle that absorbs light having first wavelengths and re-emits light having second wavelengths that are different from the first wavelengths, regardless of the delay between absorption and re-emission and regardless of the wavelengths involved. For example, "down-conversion" luminescent materials may absorb light having shorter wavelengths and re-emit light having longer wavelengths. A wide variety of luminescent materials are known, with example materials being disclosed in, for example, U.S. Pat. No. 6,600,175 and U.S. Patent Application Publication No. 2009/0184616. In addition to phosphors, other luminescent materials include scintillators, day glow tapes, nanophosphors, quantum dots, fluorescent materials and phosphorescent materials. Herein, the term "recipient luminophoric medium" refers to a medium which includes one or more luminescent materials that is arranged to receive light emitted by one or more LEDs. While light emitting devices according to embodiments of the present invention are referred to herein as "phosphor-converted blue LEDs," it will be appreciated that these LEDs may use luminescent materials other than phosphors to convert some of the blue light to light having longer wavelengths.

Example recipient luminophoric mediums 140 include one or more layers of clear encapsulants (e.g., epoxy-based or silicone-based curable resins) that include luminescent materials such as particles of a green phosphor and/or particles of a yellow phosphor. In the depicted embodiment, the recipient luminophoric medium 140 is coated on the LED 120. Suitable methods of coating the recipient luminophoric medium 140 onto the LED 120 are described in U.S. Patent Publication Nos. 2007/0158668; 2008/0173884; 2008/0179611; 2010/0155763; 2012/0193648; and 2013/0119418. As noted above, the recipient luminophoric medium 140 may be designed to only down-convert a small percentage of the light emitted by the blue LED (e.g., less than 5%). Accordingly, the recipient luminophoric medium 140 may comprise a thin layer of material and/or may have a small "loading" percentage, where the "loading" of the recipient luminophoric medium refers to the percentage, by weight, that the luminescent materials comprise of the recipient luminophoric medium. In some embodiments, the loading may be less than 40%. In some embodiments, the recipient luminophoric medium 140 may have an average thickness of less than 30 microns. In example embodiments, this average thickness may be less than 20 microns. In example embodiments, the average thickness may be between about 2 and about 15 microns thick.

A wide variety of green and or yellow light emitting luminescent materials may be used in the recipient luminophoric mediums 140 of the light emitting devices 100 according to embodiments of the present invention. A non-exclusive list of acceptable phosphors includes $Lu_3Al_5O_{12}:Ce^{3+}$; $Lu_{3-y}Y_yAl_5O_{12}:Ce^{3+}$; $Lu_{3-y}Al_{5-x}Ga_xO_{12}:Ce^{3+}$; $Lu_{3-y}Y_yAl_{5-xy}Ga_xO_{12}:Ce^{3+}$; $BOSE:Eu^{2+}$; $\beta$-SIALON ceramics doped with $Eu^{2+}$; $Ba_2Si_2O_2N:Eu^{2+}$; $Ba_3Si_6O_{12}N_2:Eu^{2+}$; $\gamma$-$ALON:Mn^{2+}$. Herein, $Lu_3Al_5O_{12}:Ce^{3+}$, $Lu_{3-y}Y_yAl_5O_{12}:Ce^{3+}$, $Lu_{3-y}Al_{5-xy}Ga_xO_{12}:Ce^{3+}$ and $Lu_{3-y}Y_yAl_{5-xy}Ga_xO_{12}:Ce^{3+}$ are collectively referred to as "LuAG:Ce phosphors."

An optical element or lens 150 (see FIG. 3B) may be formed on the top surface of the submount 110 over the LED 120 to provide environmental and/or mechanical protection. The lens 150 can be formed, for example, using molding techniques such as those described in U.S. patent application Ser. No. 11/982,275. The lens 150 may be any appropriate shape such as, for example, hemispheric, and can be formed of various materials such as silicones, plastics, epoxies or glass. The lens 150 can be textured to improve light extraction. In some embodiments, the recipient luminophoric medium 140 may be incorporated into the lens 150 or coated onto an interior and/or exterior surface of the lens 150, instead of being coated on the LED 120. In other embodiments, the recipient luminophoric medium 140 may be embodied as an encapsulant material (not shown) that is provided between the LED 120 and the lens 150 or in any other suitable location where the recipient luminophoric medium 140 may receive at least some of the light emitted by the LED 120 and convert at least some of the emitted light to light having different wavelengths.

The die attach pad 112 is mounted on the top surface of the submount 110, and the first contact pad 114 may be integral with the die attach pad 112 or electrically connected thereto. The LED 120 may be mounted in a center region of the die attach pad 112. The die attach pad 112 and first and second contact pads 114, 116 may comprise metals or other conductive materials such as, for example, copper. In the depicted embodiment, the top surface 118 of the submount 110 comprises a conductive material that electrically connects the first contact pad 114 to the die attach pad 112. Accordingly, an electrical signal that is input to the first contact pad 114 may be transmitted to the contact (not shown) on the bottom surface of the LED 120 through the die attach pad 112. The second contact pad 116 may also be mounted on the top surface 118 of the submount 110. The second contact pad 116 is electrically connected to the wire bonds 132 via the conductive top surface 118 of the submount 110. The top surface 118 of the submount 110 may include a trench 119 where the conductive material is removed or omitted to electrically isolate the first contact 114 from the second contact 116.

An electrical signal is applied to the LED 120 through the first and second contact pads 114, 116, with the electrical signal on the first pad 114 passing directly to the contact on the bottom surface of the LED 120 through the die attach pad 112 and the signal from the second pad 116 passing into the LED 120 through the wire bonds 132.

Figure 4A:
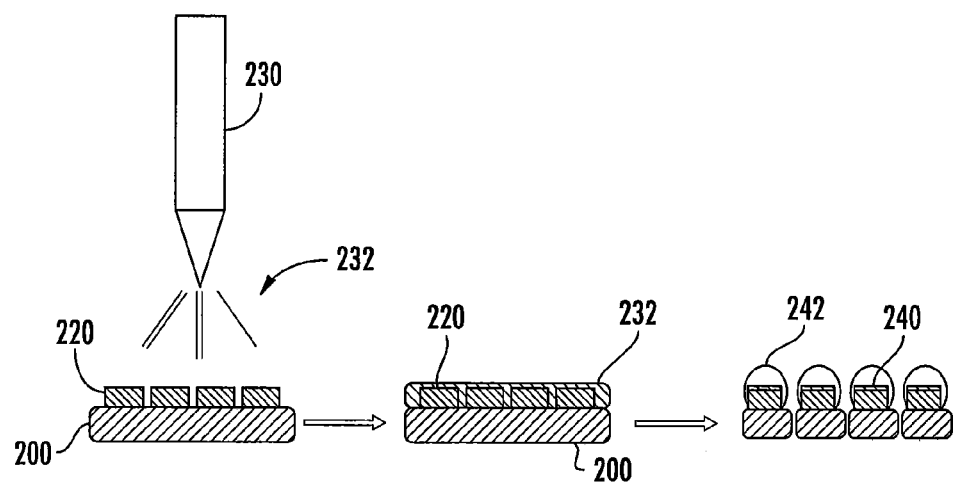
FIGS. 4A and 4B are schematic diagrams illustrating example processes for forming blue light emitting devices that include phosphor-converted blue LEDs according to embodiments of the present invention.
Figure 4B:
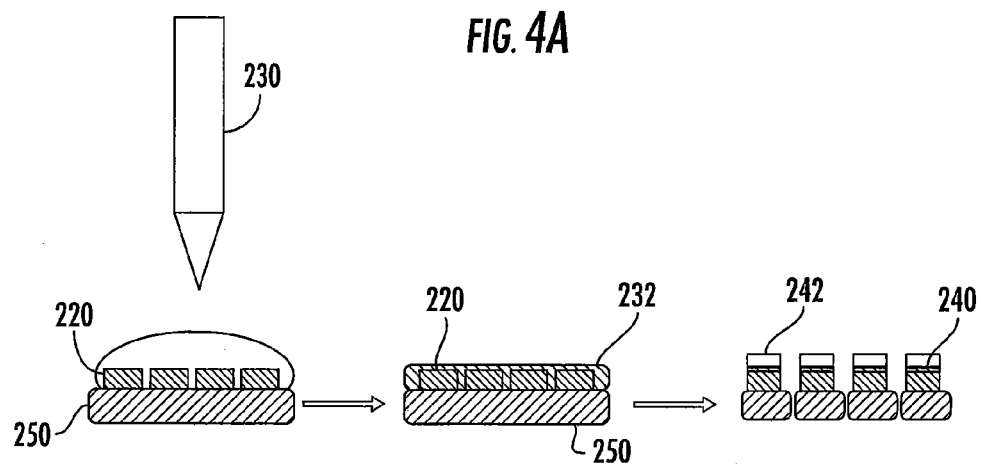

FIGS. 4A and 4B are schematic diagrams illustrating example processes for forming blue light emitting devices that include phosphor-converted blue LEDs according to embodiments of the present invention. As shown in FIG. 4A, in a first process, a plurality of individual LED dies 220 may be mounted on a panel 200 and then passed through a spray-coating apparatus 230 in order to spray coat a material 232 onto the LEDs 220 that will form a recipient luminophoric medium 240 of the LEDs 220. The material 232 that is coated onto the LEDs 220 may comprise, for example, a silicone-based resin that includes phosphor particles that down-convert blue light to light having a peak wavelength in the green or yellow color ranges. The LEDs 220 may be spray coated in one or more passes through the spray-coating apparatus 230 until a desired thickness of the phosphor-loaded silicone-based resin 232 is deposited on top and side surfaces of the LEDs 220 and/or until a desired emission is obtained (e.g., light having chromaticity coordinates within a pre-selected range). The panel 200 with the LEDs 220 having the phosphor-loaded silicone-based resin 232 thereon may then be cured (e.g., via heat curing, ultraviolet light curing, etc.) to harden the phosphor-loaded silicone-based resin 232 into a recipient luminophoric medium 240. The panel 200 may then be singulated and the LEDs 220 may be further packaged to provide blue light emitting devices 242 that each comprise an LED 220 that has a thin recipient luminophoric medium 240 thereon.

As shown in FIG. 4B, a similar process may be performed on a semiconductor wafer 250 that has a plurality of semiconductor LED dies 220 thereon. The wafer 250 is passed through the spray-coating apparatus 230 in order to spray coat a material 232 onto the LEDs 220 that will form a recipient luminophoric medium 240. The material 232 that is coated onto the LEDs 220 may comprise, for example, a silicone-based resin that includes phosphor particles that down-convert blue light to light having a peak wavelength in the green or yellow color ranges. The LEDs 220 may be spray coated in one or more passes through the spray-coating apparatus 230 until light emitted by a representative one of the LEDs 220 has chromaticity coordinates within a pre-selected range and/or until a desired thickness of the phosphor-loaded silicone-based resin 232 is deposited on top and side surfaces of the LEDs 220. The wafer 250 with the LEDs 220 having the phosphor-loaded silicone-based resin 232 thereon may then be cured (e.g., via heat curing, ultraviolet light curing, etc.) to harden the phosphor-loaded silicone-based resin 232 into a recipient luminophoric medium 240. The wafer 250 may then be singulated and the LEDs 220 may be further packaged to provide blue light emitting devices 242 that each comprise an LED 220 that has a thin recipient luminophoric medium 240 thereon.

Figure 5A:
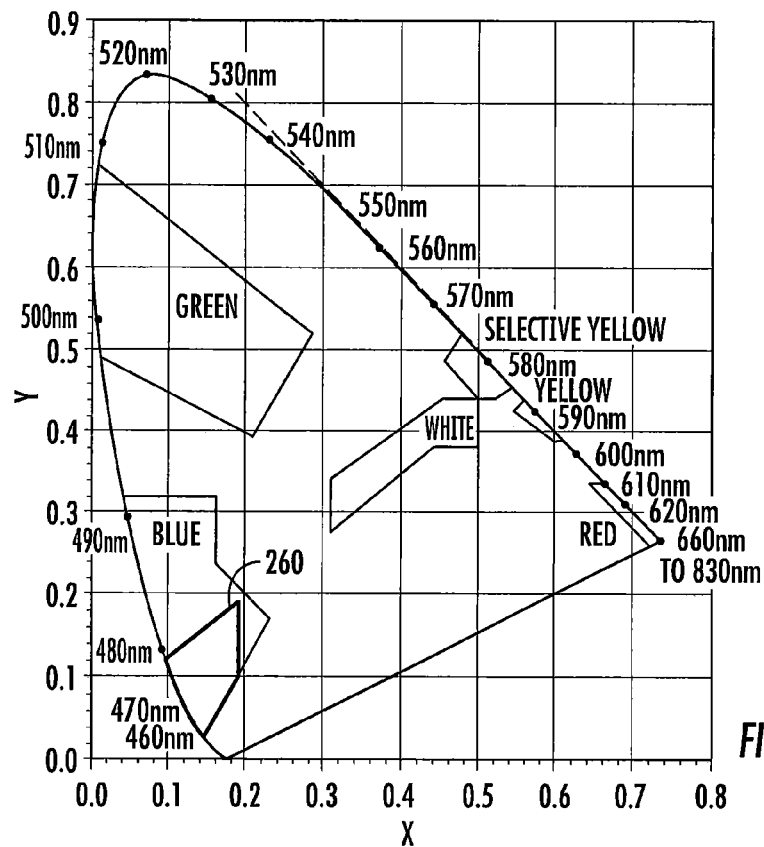
FIG. 5A is another version of the 1931 CIE Chromaticity Diagram that illustrates regions of the diagram that correspond to various colors.
Figure 5B:
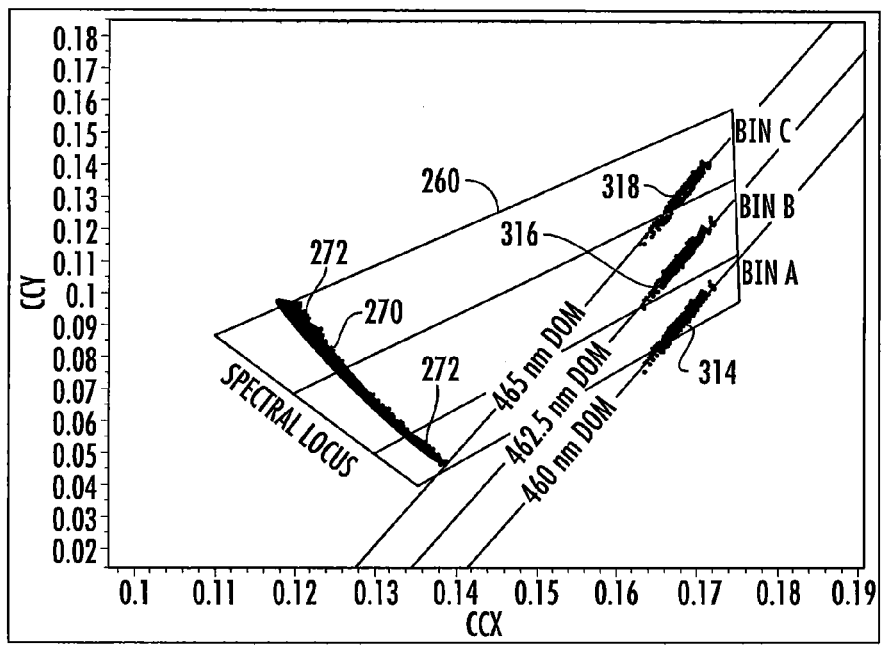
FIG. 5B is an enlarged view of a portion of FIG. 5A that illustrates several standardized "color bins" for blue light that are specified on the diagram and how phosphor-converted blue LEDs according to embodiments of the present invention may be provided that emit light having color points that fall within these color bins.

FIG. 5A is another version of the 1931 CIE Chromaticity Diagram that illustrates regions of the diagram that correspond to various colors. FIG. 5B is an enlarged view of a portion of FIG. 5A that illustrates several standardized "color bins" for blue light that are specified on the diagram and how phosphor-converted blue LEDs according to embodiments of the present invention may be provided that emit light having color points that fall within these color bins.

As shown in FIG. 5A, various regions of the 1931 CIE Chromaticity Diagram correspond to certain colors. The SAE International Surface Vehicle Standard J578 (July, 2012) defines various "color bins" on the 1931 CIE Chromaticity Diagram. Each color bin may be defined by a series of (ccx, ccy) chromaticity coordinates and/or by a series of equations relating to such coordinates. Of particular interest with respect to the present application is the region of the 1931 CIE Chromaticity Diagram that corresponds to the color blue. As shown in FIG. 5B, which is an enlarged view of a portion of FIG. 5A, a number of color bins are defined within the blue region including color bins A, B and C. Color bin A is defined by the following (x, y) chromaticity coordinates: (0.1297, 0.0503), (0.1355, 0.0399), (0.175, 0.0985), (0.1748, 0.1131), (0.1297, 0.0503). Color bin B is defined by the following (x, y) chromaticity coordinates: (0.1297, 0.0503), (0.1195, 0.0688), (0.1746, 0.1369), (0.1748, 0.1131), (0.1297, 0.0503). Color bin C is defined by the following (x, y) chromaticity coordinates: (0.1746, 0.1369), (0.1743, 0.1581), (0.1096, 0.0868), (0.1195, 0.0688), (0.1746, 0.1369). Color bins A-C plot to the region labeled 260 in FIG. 5A. Color bins A-C correspond to the region 260 defined by chromaticity coordinates (0.1355, 0.0399), (0.175, 0.0985), (0.1743 0.1581), (0.1096, 0.0868), (0.1355, 0.0399).

As shown in FIG. 5B, the region 260 that color bins A-C together form has a geometric shape that is almost a quadrilateral. In particular, region 260 has three straight sides and a fourth side (the lower, left hand side) which is slightly curved. The slightly curved side of region 260 extends along the "spectral locus" 262, which refers to the boundary of the U-shaped region on the 1931 CIE Chromaticity Diagram. The spectral locus 262 represents fully saturated (i.e., monochromatic) light at wavelengths within the visible light spectrum. As can be seen in FIGS. 5A and 5B, color bins A-C extend some distance inwardly from the spectral locus 262 and hence encompass a range of unsaturated color hues that will generally be perceived by a human observer as corresponding to blue light.

A swath 270 of data points 272 are plotted on FIG. 5B slightly inwardly from the spectral locus 262. Each data point 272 represents the color point of a conventional blue LED. The data points 272 near the bottom of the swath 270 correspond to conventional blue LEDs that have peak wavelengths of about 460 nanometers while the data points 272 near the top of the swath 270 correspond to conventional blue LEDs that have peak wavelengths of about 475 nanometers (dominant wavelength of about 480 nanometers). As shown in FIG. 5B, the data points 272 in swath 270 are located at color points that are slightly inward of the spectral locus 262, as blue LEDs do not emit truly monochromatic light, but instead emit light in a concentrated wavelength range about the peak wavelength. As can also be seen from FIG. 5B, color bins A-C extend inwardly a significant distance past the color points that correspond to the conventional the blue LEDs (i.e., the data points 272 in swath 270) to encompass color points corresponding to less saturated light sources.

Embodiments of the present invention add, for example, a thin phosphor coating to conventional blue LEDs to shift the color point of the blue LED to color points near the right sides of color bins A-C using green or yellow phosphor particles. Three swaths 314, 316, 318 of data points 320 are also shown in FIG. 5B that extend in three lines through the right hand side of color bins A-C. Swath 314 illustrates the color points for a set of LEDs 330 have a dominant wavelength of 460 nanometers (which corresponds to a peak wavelength of 453 nanometers). Each of these LEDs 330 was coated with a thin coating of a LuAG:Ce phosphor having a peak emission wavelength of about 535 nanometers. Swath 316 illustrates the color points for a set of LEDs 332 that have a dominant wavelength of 462.5 nanometers (which corresponds to a peak wavelength of 455.5 nanometers). Each of these LEDs 332 was coated with a thin coating of the LuAG:Ce phosphor having a peak emission wavelength of about 535 nanometers. Swath 318 illustrates the color points for a set of LEDs 334 that have a dominant wavelength of 465 nanometers (which corresponds to a peak wavelength of 458 nanometers). Each of these LEDs 334 was coated with a thin coating of a LuAG:Ce phosphor having a peak emission wavelength of about 535 nanometers. Since only a small amount of LuAG:Ce phosphor is used in each case, the blue light emitted by the LEDs 330, 332, 334 dominates the green and yellow light emitted by the phosphor so that the combined light output will still appear as blue light to a human observer. However, even though only a small amount of green and yellow light is emitted, the high sensitivity of the human eye to this light can significantly increase the luminous flux of the device.

Figure 6:
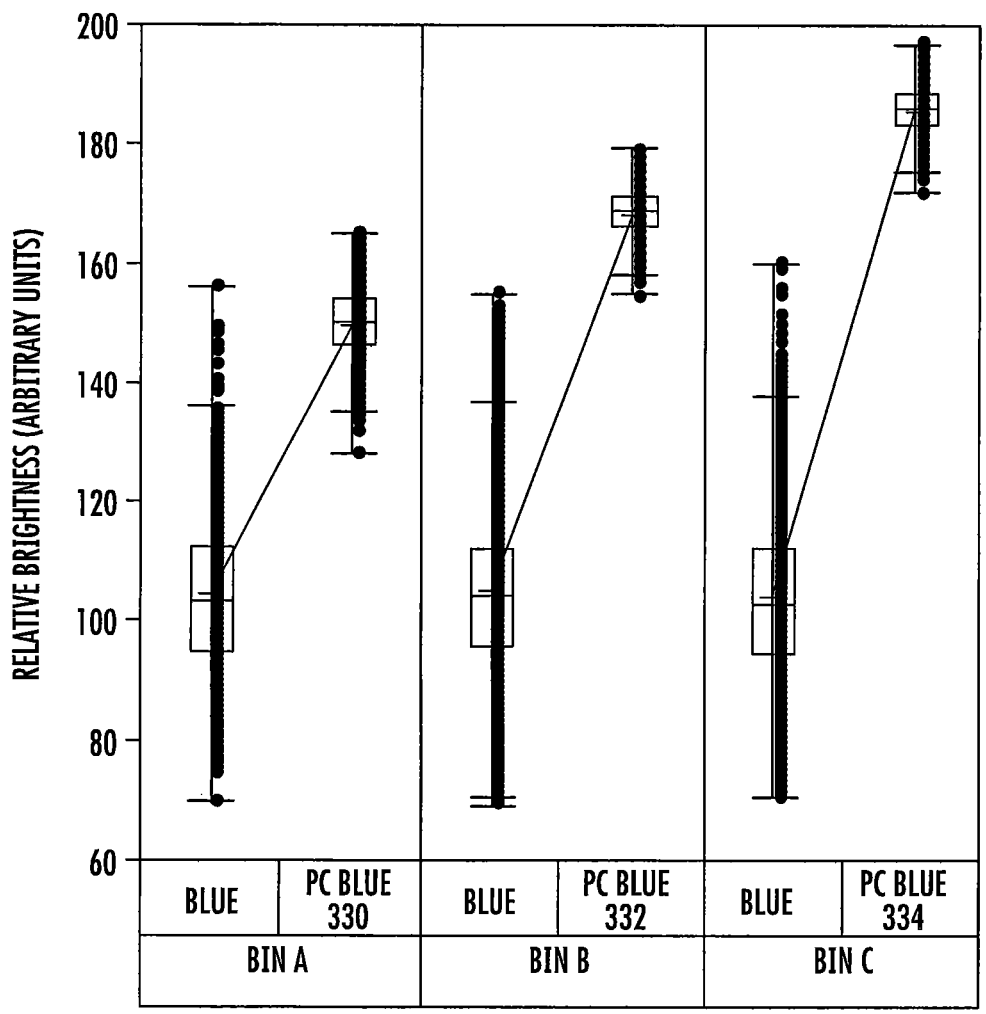
FIG. 6 is a schematic diagram illustrating the increased lumen output of blue light emitting devices that include phosphor-converted blue LEDs according to embodiments of the present invention as compared to conventional blue LEDs.

In particular, FIG. 6 is a schematic diagram illustrating the increased lumen output of the blue light emitting phosphor-coated blue LEDs 330, 332, 334 of FIG. 5B as compared to the lumen output of comparable conventional blue LEDs. As shown in the left hand column of FIG. 6, conventional blue LEDs having a dominant wavelength of 460 nanometers output light having a luminous flux ranging from about 70 to 155 on an arbitrary unit (AU) scale with an average intensity of about 105 AU. Coating the same conventional blue LEDs with a thin LuAG:Ce phosphor resulted in light emitting devices having a luminous flux of between about 130 AU and 168 AU, with an average luminous flux of about 150 AU. This represents more than a 40% increase in luminous flux.

As shown in the middle column of FIG. 6, conventional blue LEDs having a dominant wavelength of 462.5 nanometers also output light having a luminous flux ranging from about 70 to 155 on an arbitrary unit (AU) scale with an average intensity of about 107 AU. Coating the same conventional blue LEDs with a thin LuAG:Ce phosphor resulted in light emitting devices having a luminous flux of between about 160 AU and 180 AU, with an average luminous flux of about 170 AU. This represents nearly a 60% increase in luminous flux.

As shown in the right hand column of FIG. 6, conventional blue LEDs having a dominant wavelength of 465 nanometers output light having a luminous flux ranging from about 70 to 162 on an arbitrary unit (AU) scale with an average intensity of about 110 AU. Coating the same conventional blue LEDs with a thin LuAG:Ce phosphor resulted in light emitting devices having a luminous flux of between about 172 AU and 198 AU, with an average luminous flux of about 190 AU. This represents nearly a 75% increase in luminous flux.

Figure 7A:
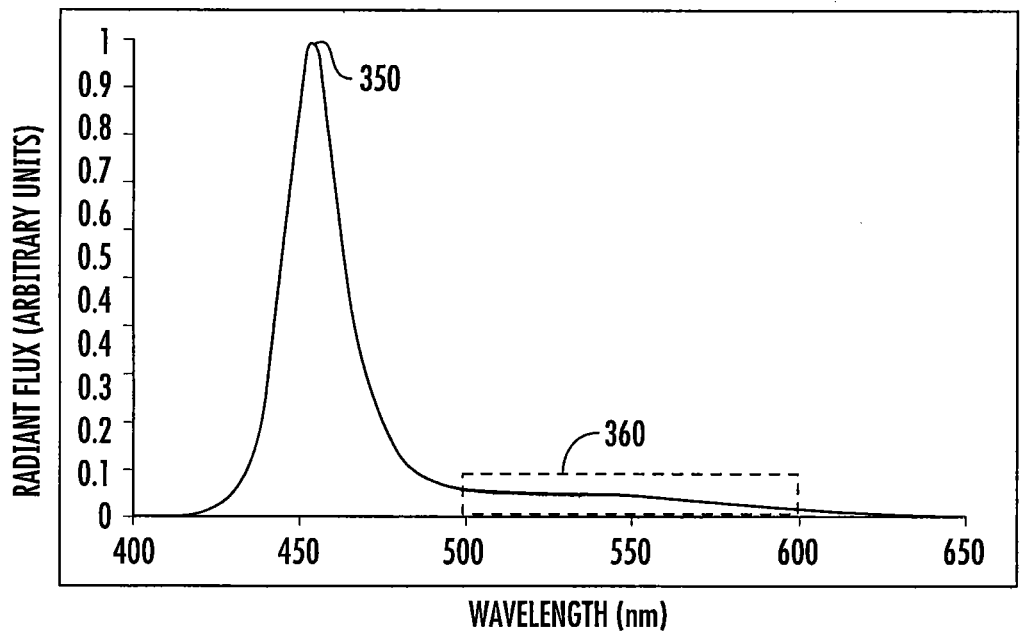
FIG. 7A is a graph that illustrates the radiometric emission spectra for a blue light emitting device that includes a phosphor-converted blue LED according to an embodiment of the present invention.

FIG. 7A is a graph that illustrates the radiometric emission spectra for a blue light emitting phosphor-converted blue LED according to an embodiment of the present invention.

Figure 7B:
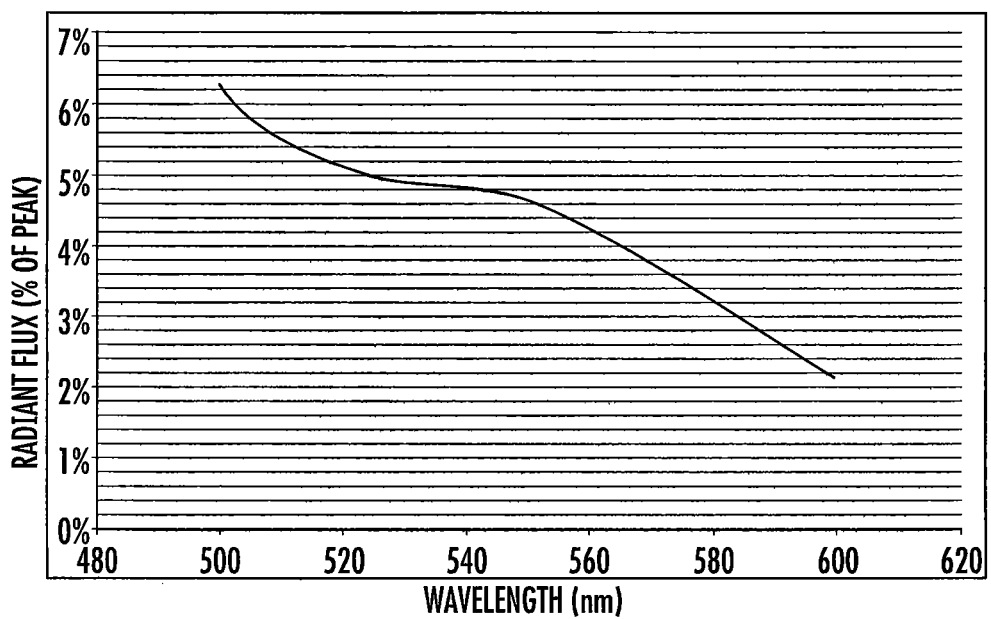
FIG. 7B is an enlarged view of a portion of the graph of FIG. 7A that better illustrates the contribution of the recipient luminophoric medium to the luminous output of the device.

The light emitting device used to generate the radiometric emission spectra of FIG. 7A comprises a blue LED 120 that emits blue light having a peak wavelength of about 460 nanometers that has a thin recipient luminophoric medium 140 coated thereon that includes LuAG:Ce phosphor particles having a peak wavelength of about 535 nanometers. FIG. 7B is an enlarged view of a portion of the graph of FIG. 7A that better illustrates the contribution of the recipient luminophoric medium to luminous output of the device.

As shown in FIG. 7A, the radiometric emission spectrum of the blue light emitting phosphor-converted blue LED includes a large peak 350 centered around the peak wavelength of the blue LED 120 that trails off on the left hand side of FIG. 7A in a manner consistent with a bare LED that does not include a recipient luminophoric medium. However, to the right of the peak 350, the "tail" decays somewhat more slowly, and stays above 2% of the peak radiant power for wavelengths below 600 nanometers. The shape of the "tail" to the right of peak 350 reflects the contribution of the small amount of light emitted by the LuAG:Ce phosphor particles in the recipient luminophoric medium 140, which generate a small, wide peak that is centered about 535 nanometers (note that an actual secondary peak may not appear in the emission spectra depending upon the design of the device).

In some embodiments, the combined light of the blue LED 120 and the light emitted by the luminescent materials in the recipient luminophoric medium 140 may be designed to have a radiometric emission spectra that has a spectral power output in the wavelength range of 500 nanometers to 570 nanometers that is between 2% and 9% of the spectral power output at the peak wavelength of the blue LED. For example, as shown in FIG. 7A, radiant flux (in arbitrary units) at the peak emission wavelength (about 460 nanometers) of the blue LED is 1.0 AU. As shown in FIG. 7B, which is an enlarged view of the portion of FIG. 7A contained in the box labeled 360, the radiant flux varies between about 6.2% and 3.8% of the peak radiant flux of the blue LED between 500 nanometers and 570 nanometers.

It has been found that by including a recipient luminophoric medium with the blue LED that generates sufficient green and yellow light to impact the radiometric emission spectrum in this manner, light emitting devices may be provided that may exhibit increased luminous flux while still emitting light that will appear as blue light to a human observer. Thus, embodiments of the present invention provide a mechanism for obtaining brighter blue light emitting semiconductor light emitting devices.

Blue LEDs have been commercially available for over two decades, and have been used in a wide variety of different applications. In many of these applications, the luminous flux of the blue LED is an important parameter of the LED, as, for example, the higher the luminous flux the fewer blue LEDs that may be required. Despite this, the conventional solution for providing higher power solid state light emitting devices that emit blue light was to (1) use longer wavelength blue LEDs that emit light that the human eye is more sensitive to or (2) to improve the design of the LED to provide higher power output. Pursuant to embodiments of the present invention, high power solid state light emitting devices are provided that emit blue light that use phosphor-converted blue LEDs. Only a small amount of phosphor (or other luminescent material) is used, however, so that the light emitted by the device will still appear blue. However, by reducing the saturation of the emitted light and, in particular, by doing so using luminescent materials that emit green and/or yellow light that is at or near the peak of the eye sensitivity curve of FIG. 2, it is possible to stay within the blue color range while significantly increasing the brightness of the combined light output as perceived by a human observer.

Referring again to FIGS. 5A and 5B, it will be understood that a wide variety of combinations of light sources may be used to obtain light having color points within color bins A-C. As a first example, conventional blue LEDs having peak wavelengths of about 458 nanometers to about 470 nanometers will typically have color points that fall within color bins A-C. As another example, a conventional blue LED having a peak wavelength of, for example, about 450 nanometers may be combined, in appropriate proportions, with a second light source that has a dominant wavelength of between about 500 nanometers and 555 nanometers to provide a combined light having a color point within color bins A-C. As yet another example, a cyan LED could be combined with a magenta light source to provide a combined light having a color point within color bins A-C.

Pursuant to embodiments of the present invention, the response of the human eye is taken into account in selecting which color light sources to use to provide a light emitting device having a color point that falls within color bins A-C. In particular, light having a dominant wavelength near a peak of the eye sensitivity curve of FIG. 2 may be combined with blue light from a blue LED in order to provide a blue light emitting device having a higher luminous flux. As discussed below, this may typically be achieved by moving the color point for the blue light toward the right sides of color bins A-C by adding a small amount of green or yellow light, as will be discussed in more detail with reference to FIGS. 8A and 8B.

Figure 8A:
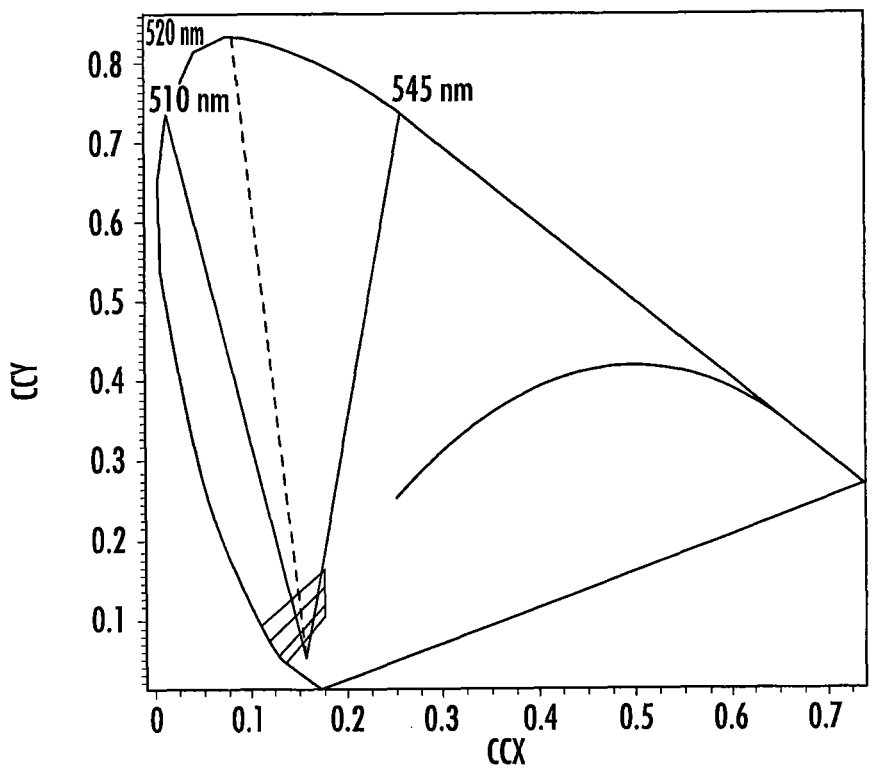
FIGS. 8A and 8B are additional reproductions of the 1931 CIE Chromaticity Diagram that illustrate ranges for the dominant wavelengths of the blue LEDs and the luminescent materials in the recipient luminophoric medium for blue light emitting devices according to some embodiments of the present invention.
Figure 8B:
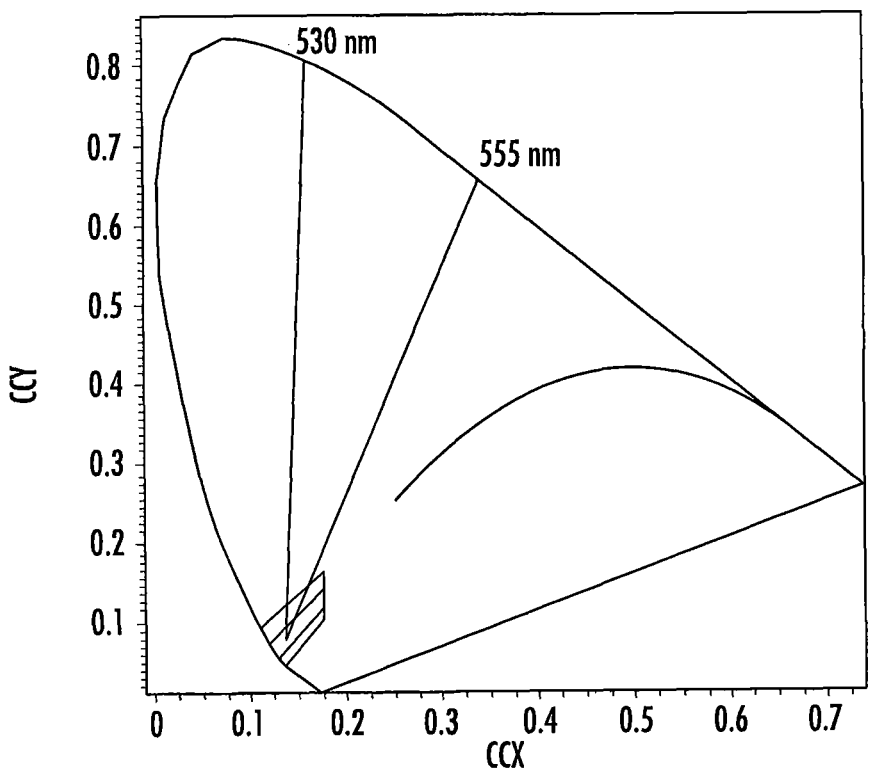

FIGS. 8A and 8B are additional reproductions of the 1931 CIE Chromaticity Diagram that illustrate ranges for the dominant wavelengths of the blue LEDs and the luminescent materials in the recipient luminophoric medium for blue light emitting devices according to some embodiments of the present invention. In FIGS. 8A and 8B, region 260 corresponds to color bins A-C.

Referring to FIG. 8A, it can be seen that blue LEDs having peak wavelengths below about 458 nanometers will have color points slightly inward of the spectral locus that generally fall below color bins A-C. By combining the light of such blue LEDs with light having a dominant wavelength between about 510 nanometers and 545 nanometers it is possible to provide a light emitting device having a color point within the right side of color bins A-C. As discussed above, the human eye has the highest sensitivity to light having a wavelength of about 555 nanometers. The right hand side of each of color bins A-C is closer to the color point for monochromatic light having a wavelength of 555 nm than is the left hand side of each color bin. Accordingly, all else being equal, the brightest blue light emitting devices may be obtained by adding greater amounts of green or yellow light to a blue LED, which will result in a color point more toward the right side of color bins A-C. Thus, pursuant to some embodiments of the present invention, light emitting devices may be provided that emit light having a color point that falls within the region on the 1931 CIE Chromaticity Diagram defined by ccx, ccy chromaticity coordinates of (0.16, 0.07621), (0.175, 0.0985), (0.1743 0.1581), (0.16, 0.1423), (0.16, 0.07621). This region of color points generally corresponds to the right side of color bins A-C.

As is shown in FIG. 8A, for blue LEDs having peak wavelengths below about 455 nanometers, light having color points in the green portion of the 1931 CIE Chromaticity Diagram can be combined with the light from the blue LED to produce light having a color point in the right side of color bins A-C. As is apparent from FIG. 8A and the discussion herein, luminescent materials that convert blue light to light having a dominant wavelength between about 510 nanometers and 545 nanometers may be particularly effective at providing light emitting devices that emit light in color bins A-C that have a high luminous output. As shown by the dotted line in FIG. 8A, in some embodiments the luminescent materials may emit light having a dominant wavelength within the range of 520 nanometers to 545 nanometers, which will typically provide improved luminous flux as compared to luminescent materials emitting light at lower dominant wavelengths.

As shown in FIG. 8B, for blue LEDs having peak wavelengths in the 456-480 nanometer range, light having color points in the green or yellow portion of the 1931 CIE Chromaticity Diagram can be combined with the light from the blue LED to produce light having a color point in the right side of color bins A-C. Thus, blue LEDs having peak wavelengths in this range are more appropriately used in conjunction with luminescent materials that convert blue light to light having a dominant wavelength between about 530 nanometers and 555 nanometers. The particular combination of blue LED and luminescent material may be selected based on a number of factors including, for example, the peak wavelength of the LEDs, the desired color bin, any desired hue for the combined light output, the dominant wavelengths of the luminescent materials and the location of resulting color points of the combined light output.

In some embodiments, the blue LEDs may have peak wavelengths that are in the lower portion of the wavelengths that are generally associated with monochromatic blue light. For example, monochromatic light having wavelengths from about 430 nanometers to as high as 495 nanometers may be considered to qualify as blue light. The wavelength range that corresponds to blue light does not have a firm definition, and may be defined more narrowly when the range of colors is extended beyond purple-blue-green-yellow-orange-red to include more intermediate colors such as indigo (between blue and purple) or cyan or aqua (both of which are between blue and green). For purposes of the present disclosure, monochromatic light having a peak wavelength in the range between 430 nanometers and 480 nanometers is considered to be blue light. In some embodiments, the blue LEDs may have a peak wavelength between 430 nanometers and 458 nanometers, which is in the lower half of the wavelength range for blue light that is used herein. In other embodiments, the blue LEDs may have a peak wavelength between 430 nanometers and 465 nanometers. In still other embodiments, the blue LEDs may have a peak wavelength between 430 nanometers and 480 nanometers. Blue LEDs having peak wavelengths in the above-identified range may be preferred in some embodiments because they may exhibit better reliability and/or higher radiant flux over the range of expected operating temperatures for the light emitting device. However, while blue LEDs with lower peak wavelengths are used in some embodiments, it will be appreciated that the invention is not limited to such blue LEDs.

The light output by the luminescent materials in the recipient luminophoric medium, so long as it is above the blue color range, will generally dilute the blue light emitted by the LED. As only a limited amount of dilution may occur if the combined light output is to appear blue to a human observer, the light emitting devices according to embodiments of the present invention may be designed so that only a small portion of the light output by the blue LED is down-converted in the recipient luminophoric medium. In order to enhance the luminous flux of the light emitting device, it may be advantageous to convert a small amount of the blue light to light that is near the peak of the eye sensitivity curve (i.e., near 555 nanometers). Thus, in some embodiments, the luminescent materials included in the recipient luminophoric mediums of the light emitting devices according to embodiments of the present invention may be narrow band emitters such as, for example, quantum dots that have FWHM widths of less than 30 nanometers. These narrow band emitters may have a peak wavelength of, for example, between 535 nanometers and 555 nanometers.

Figure 9:
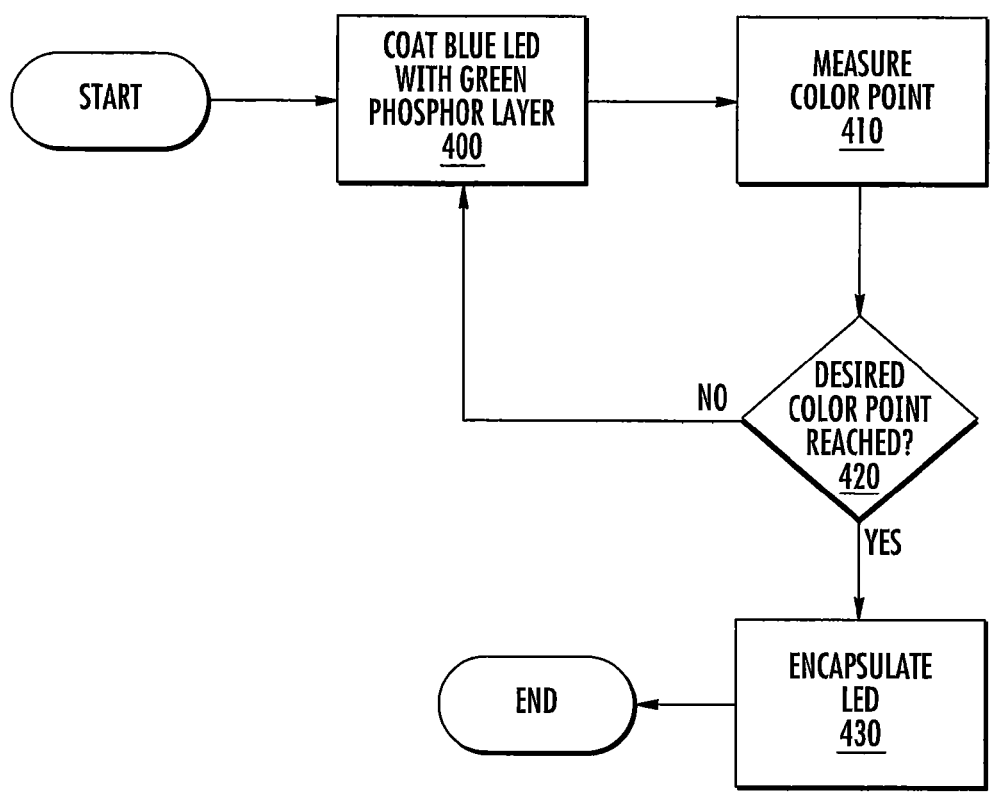
FIG. 9 is a flow chart illustrating a method of fabricating a solid state blue light emitting device according to certain embodiments of the present invention.

FIG. 9 is a flow chart illustrating a method of fabricating a solid state blue light emitting device according to certain embodiments of the present invention. As shown in FIG. 9, pursuant to this method, a plurality of LEDs that emit light having a peak wavelength between 430 nanometers and 465 nanometers are coated with a layer of luminescent materials in an encapsulant (Block 400). The luminescent materials may be materials that emit light having a peak wavelength that is between about 500 nanometers and about 545 nanometers when excited by light having the peak wavelength of the LED. Next, the chromaticity coordinates of the light emitted by a first of the LEDs may be measured using probes that provide current to the LED (Block 410). If this measurement indicates that the chromaticity coordinates are within a desired range (block 420), then the LED may be encapsulated (Block 430). If the chromaticity coordinates are not within the desired range at block 420, then the operations of Blocks 400 and 410 may be repeated one or more times until the chromaticity coordinates of the light emitted by the LED are within the desired range. The luminescent materials that are coated onto the LEDs by this process may down-convert less than 10% of the light emitted by each LED.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The present invention has been described with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. The singular forms "a", "an" and "the" are intended to include the plural forms as well, unless the context clearly indicates otherwise. It will be further understood that, when used in this specification, the terms "comprises" and/or "including" and derivatives thereof, specify the presence of stated features, operations, elements, and/or components, but do not preclude the presence or addition of one or more other features, operations, elements, components, and/or groups thereof.

It will be understood that, although the terms first, second, etc. may be used herein to describe various elements, components, regions and/or layers, these elements, components, regions and/or layers should not be limited by these terms. These terms are only used to distinguish one element, component, region or layer from another element, component, region or layer. Thus, a first element, component, region or layer discussed below could be termed a second element, component, region or layer without departing from the teachings of the present invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure.

The expression "light emitting device," as used herein, is not limited, except that it be a device that is capable of emitting light.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A light emitting device, comprising:
   a blue light emitting diode ("LED") that emits light having a peak wavelength between 430 nanometers and 480 nanometers; and
   a recipient luminophoric medium that is configured to down-convert at least some of the blue light emitted by the blue LED, the recipient luminophoric medium including luminescent materials that down-convert a portion of the blue light emitted by the blue LED to light having a peak wavelength that is between about 500 nanometers and about 545 nanometers,
   wherein the combination of the blue light emitted by the blue LED and the light emitted by the luminescent materials in the recipient luminophoric medium comprises light that is perceived as blue light having a color point that falls within the region on the 1931 CIE Chromaticity Diagram defined by ccx, ccy chromaticity coordinates of (0.1355, 0.0399), (0.175, 0.0985), (0.1743 0.1581), (0.1096, 0.0868), (0.1355, 0.0399).

2. The light emitting device of claim 1, wherein less than 5% of the blue light emitted by the blue LED is down-converted by the luminescent materials in the recipient luminophoric medium.

3. The light emitting device of claim 1, wherein the luminescent materials down-convert a portion of the blue light emitted by the blue LED to light having a peak wavelength that is between about 530 nanometers and about 545 nanometers.

4. The light emitting device of claim 1, wherein the combination of the blue light emitted by the blue LED and the light emitted by the luminescent materials in the recipient luminophoric medium has a radiometric emission spectra that has a spectral power output throughout the wavelength range of 500 nanometers to 570 nanometers that is between 2% and 9% of the spectral power output at the peak wavelength of the blue LED.

5. The light emitting device of claim 1, wherein the combination of the blue light emitted by the blue LED and the light emitted by the luminescent materials in the recipient luminophoric medium has a radiometric emission spectra that has a spectral power output throughout the wavelength range of 520 nanometers to 560 nanometers that is between 3% and 6% of the spectral power output at the peak wavelength of the blue LED.

6. The light emitting device of claim 1, wherein the recipient luminophoric medium is coated to an average thickness of less than 20 microns on a top surface of the blue LED.

7. The light emitting device of claim 1, wherein the luminescent materials comprise LuAG:Ce phosphor particles.

8. The light emitting device of claim 1, wherein the luminescent materials comprise narrowband luminescent materials having a full width half maximum width of less than 30 nanometers.

9. The light emitting device of claim 1, wherein the blue LED has a peak wavelength between 450 and 458 nanometers.

10. The light emitting device of claim 1, wherein the recipient luminophoric medium is formed directly on a major surface of the blue LED and includes a plurality of recesses that expose portions of the major surface of the LED.

11. The light emitting device of claim 10, wherein the recesses are in a predetermined pattern.

12. A light emitting device, comprising:
    a blue light emitting diode ("LED") that emits blue light having a peak wavelength between 430 nanometers and 465 nanometers; and
    a recipient luminophoric medium that is configured to down-convert at least some of the blue light emitted by the blue LED, the recipient luminophoric medium including luminescent materials that down-convert a portion of the blue light emitted by the blue LED to light having a peak wavelength that is between about 500 nanometers and about 545 nanometers,
    wherein less than 5% of the blue light emitted by the blue LED is down-converted by the luminescent materials in the recipient luminophoric medium.

13. The light emitting device of claim 12, wherein the blue LED emits blue light having a peak wavelength between 450 nanometers and 458 nanometers.

14. The light emitting device of claim 12, wherein the luminescent materials down-convert a portion of the blue light emitted by the blue LED to light having a peak wavelength that is between about 530 nanometers and about 545 nanometers.

15. The light emitting device of claim 12, wherein the combination of the blue light emitted by the blue LED and the light emitted by the luminescent materials in the recipient luminophoric medium has a radiometric emission spectra that has a spectral power output throughout the wavelength range of 500 nanometers to 570 nanometers that is between 2% and 9% of the spectral power output at the peak wavelength of the blue LED.

16. The light emitting device of claim 12, wherein the combination of the blue light emitted by the blue LED and the light emitted by the luminescent materials in the recipient luminophoric medium comprises light that is perceived as blue light having a color point that falls within the region on the 1931 CIE Chromaticity Diagram defined by ccx, ccy chromaticity coordinates of (0.16, 0.07621), (0.175, 0.0985), (0.1743 0.1581), (0.16, 0.1423), (0.16, 0.07621).

17. A light emitting device, comprising:
    a blue light emitting diode ("LED") that emits blue light having a peak wavelength between 430 nanometers and 465 nanometers; and
    a recipient luminophoric medium that is configured to down-convert at least some of the blue light emitted by the blue LED, the recipient luminophoric medium including luminescent materials that down-convert a portion of the blue light emitted by the blue LED to light having a peak wavelength that is between about 500 nanometers and about 545 nanometers, wherein the combination of the blue light emitted by the blue LED and the light emitted by the luminescent materials of the recipient luminophoric medium has a radiometric emission spectra that has a spectral power output in the wavelength range of 500 nanometers to 570 nanometers that is between 2% and 9% of the spectral power output at the peak wavelength of the blue LED.

18. The light emitting device of claim 17, wherein less than 5% of the blue light emitted by the blue LED is down-converted by the luminescent materials in the recipient luminophoric medium.

19. The light emitting device of claim 17, wherein the luminescent materials down-convert a portion of the blue light emitted by the blue LED to light having a peak wavelength that is between about 530 nanometers and about 545 nanometers.

20. The light emitting device of claim 17, wherein the combination of the blue light emitted by the blue LED and the light emitted by the luminescent materials in the recipient luminophoric medium has a radiometric emission spectra that has a spectral power output throughout the wavelength range of 520 nanometers to 560 nanometers that is between 3% and 6% of the spectral power output at the peak wavelength of the blue LED.

21. The light emitting device of claim 17, wherein a bottom surface of the blue LED is mounted on a mounting substrate and wherein the recipient luminophoric medium is coated to an average thickness of less than 20 microns on a top surface of the blue LED.

22. A light emitting device, comprising:
a blue light emitting diode ("LED") that emits blue light having a peak wavelength between 450 nanometers and 458 nanometers; and a recipient luminophoric medium that is configured to down-convert at least some of the blue light emitted by the blue LED, the recipient luminophoric medium including luminescent materials that down-convert a portion of the blue light emitted by the blue LED to light having a peak wavelength that is between about 515 nanometers and about 545 nanometers, wherein a bottom surface of the blue LED is mounted on a mounting substrate and wherein the recipient luminophoric medium is coated to an average thickness of less than 20 microns on a top surface of the blue LED, and wherein less than 10% of the blue light emitted by the blue LED is down-converted by the luminescent materials in the recipient luminophoric medium.

23. The light emitting device of claim 22, wherein the luminescent materials comprise narrowband luminescent materials having a full width half maximum width of less than 30 nanometers.

24. The light emitting device of claim 22, wherein the combination of the blue light emitted by the blue LED and the light emitted by the luminescent materials in the recipient luminophoric medium comprises light that is perceived as blue light having a color point that falls within the region on the 1931 CIE Chromaticity Diagram defined by ccx, ccy chromaticity coordinates of (0.16, 0.07621), (0.175, 0.0985), (0.1743 0.1581), (0.16, 0.1423), (0.16, 0.07621).

25. The light emitting device of claim 22, wherein the combination of the blue light emitted by the blue LED and the light emitted by the luminescent materials in the recipient luminophoric medium has a radiometric emission spectra that has a spectral power output throughout the wavelength range of 500 nanometers to 570 nanometers that is between 2% and 9% of the spectral power output at the peak wavelength of the blue LED.

\* \* \* \* \*